United States Patent [19]
Osawa

[11] Patent Number: 5,874,748
[45] Date of Patent: Feb. 23, 1999

[54] LIGHT-EMITTING DIODE DEVICE AND ILLUMINATOR WITH LIGHT-EMITTING SURFACE USING SAME

[75] Inventor: Hideharu Osawa, Kyoto, Japan

[73] Assignee: Rohm Co., Ltd., Kyoto, Japan

[21] Appl. No.: 815,743

[22] Filed: Mar. 12, 1997

[30] Foreign Application Priority Data

Mar. 29, 1996 [JP] Japan ..................................... 8-075538
May 2, 1996 [JP] Japan ..................................... 8-111588

[51] Int. Cl.$^6$ ....................... H01L 29/41; H01L 31/0224; H01L 33/00
[52] U.S. Cl. .............................. 257/91; 257/99; 257/100; 257/669; 257/674
[58] Field of Search ................. 257/91, 99, 100, 257/669, 674

[56] References Cited

U.S. PATENT DOCUMENTS 3,717,800  2/1973  Thillays et al. .......................... 257/91
5,381,036  1/1995  Bigler ...................................... 257/674

FOREIGN PATENT DOCUMENTS 6-196478  7/1994  Japan ...................................... 257/669

*Primary Examiner*—Jerome Jackson
*Attorney, Agent, or Firm*—Majestic, Parsons, Siebert & Hsue P.C.

[57] ABSTRACT

A light-emitting diode (LED) device has a plurality of mutually separated terminal plates disposed on the bottom part of a horizontally elongated rectangular reflector case having an open front surface. Where a pair of these terminal plates is adjacent to each other with a gap in between, a LED chip is bonded to one of them and connected through a wire to the other. Terminal lead lines are extended from the terminal plates downward through the reflector case. The end parts of such a pair are shaped such that the gap therebetween has an horizontally extended part. When such a LED device is inserted into a groove formed in a light-conducting plate with a specified thickness to form an illuminator with a light-emitting surface, shearing stress is developed inside the reflector case as the terminal lead lines are passed through throughholes in the reflector case but is absorbed by the parts adjacent to such a horizontally extended portion of the gap.

17 Claims, 11 Drawing Sheets

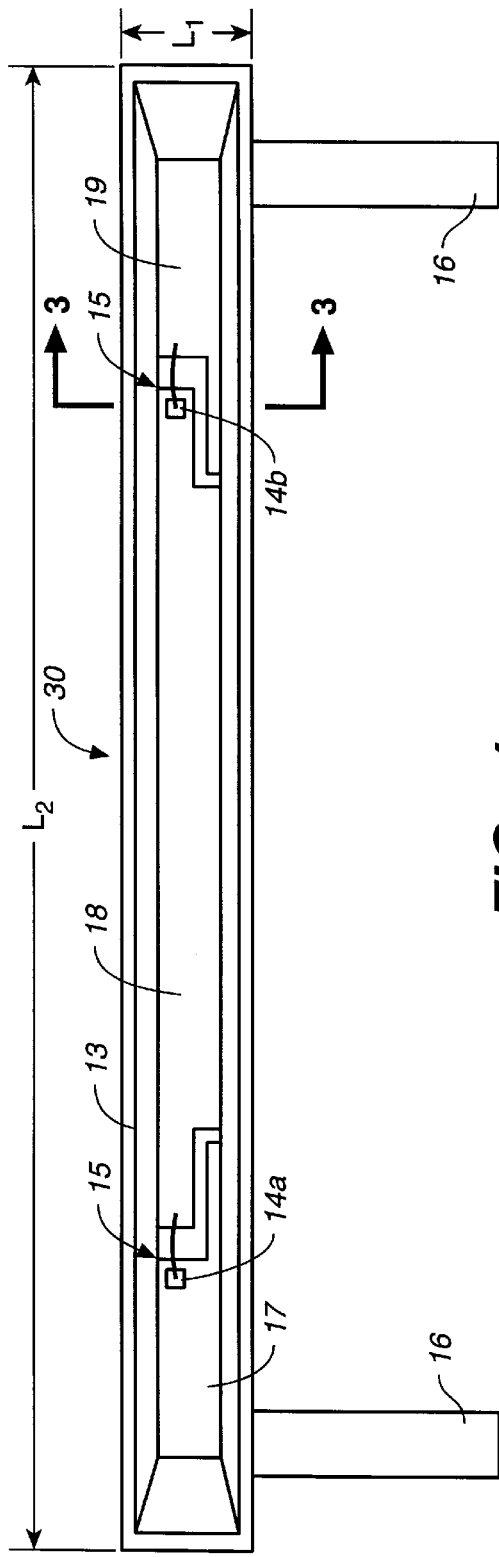
FIG._1
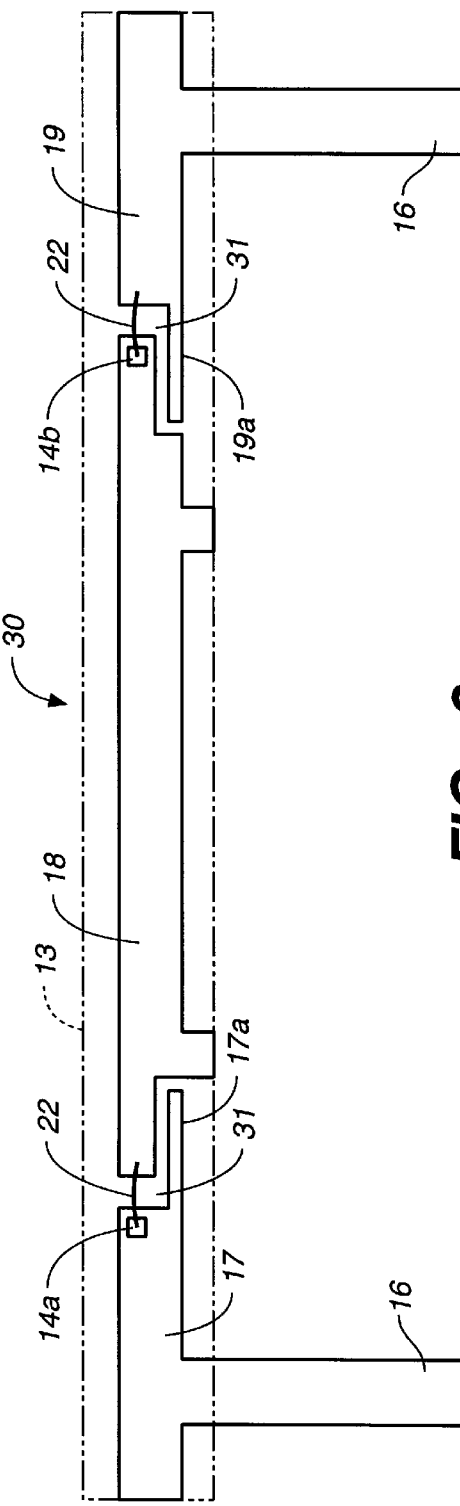
FIG._2

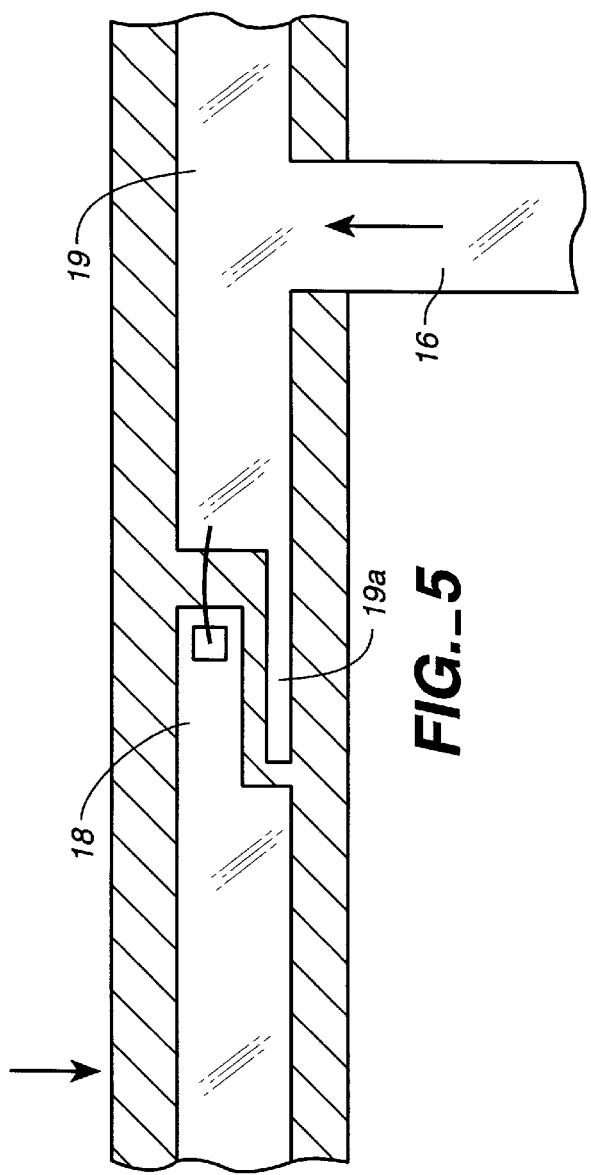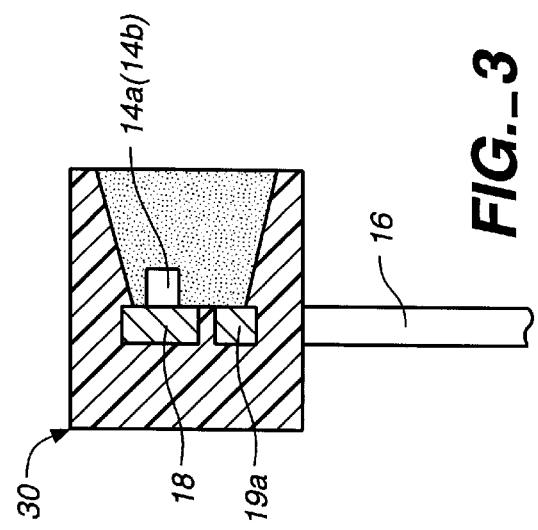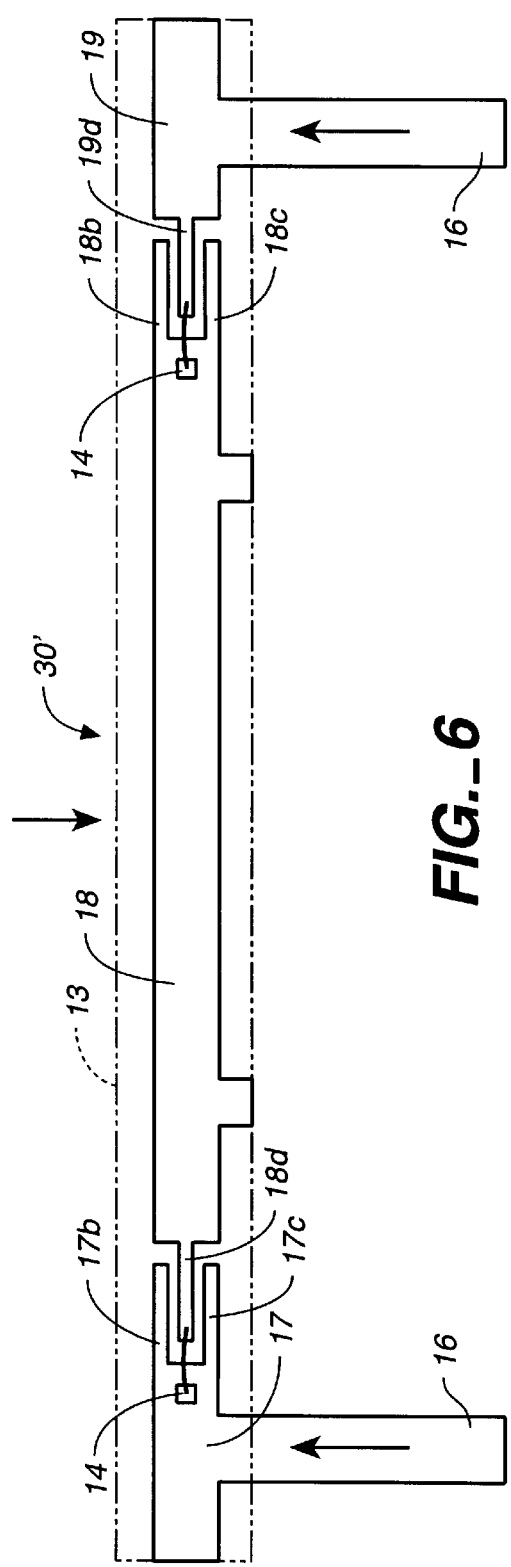

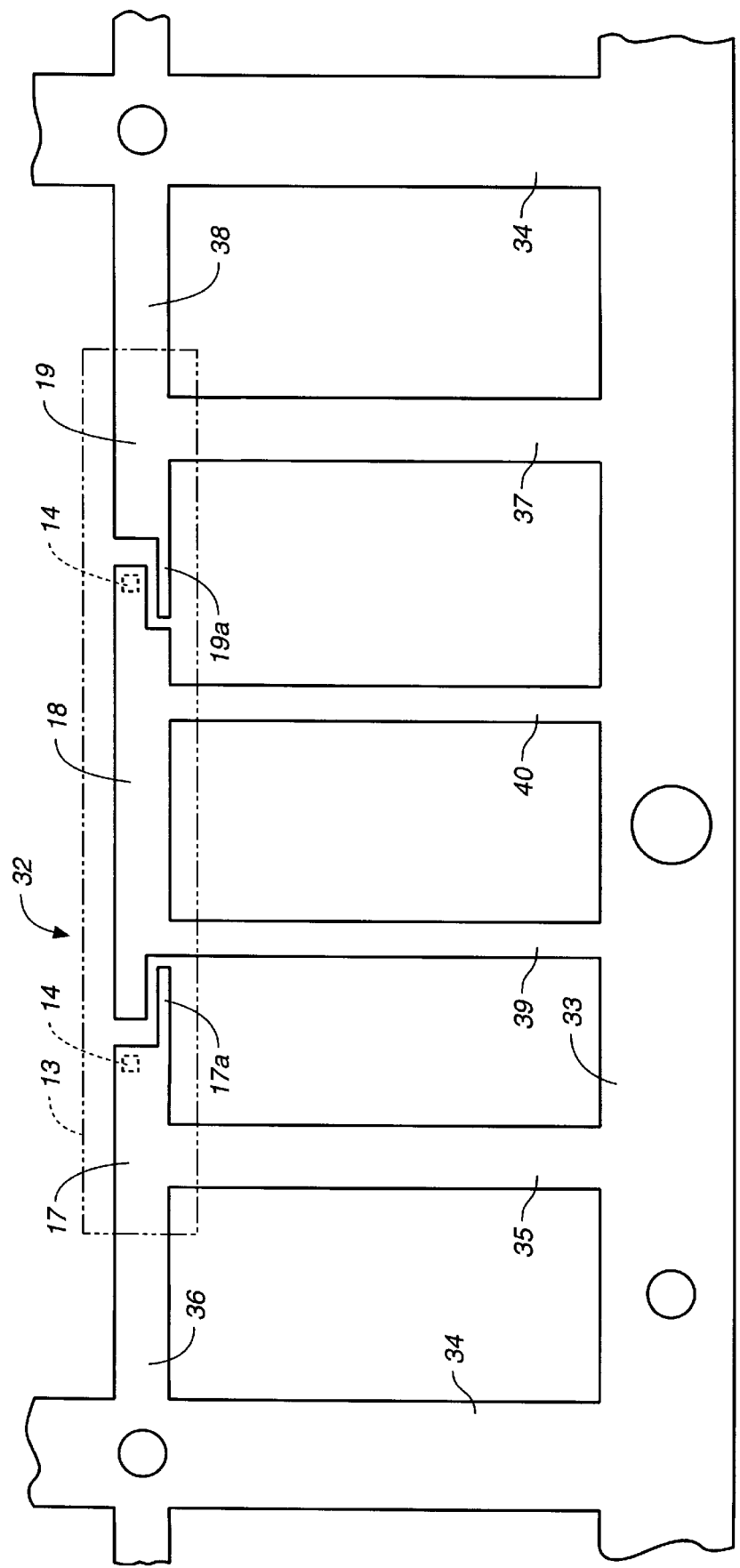
FIG._4

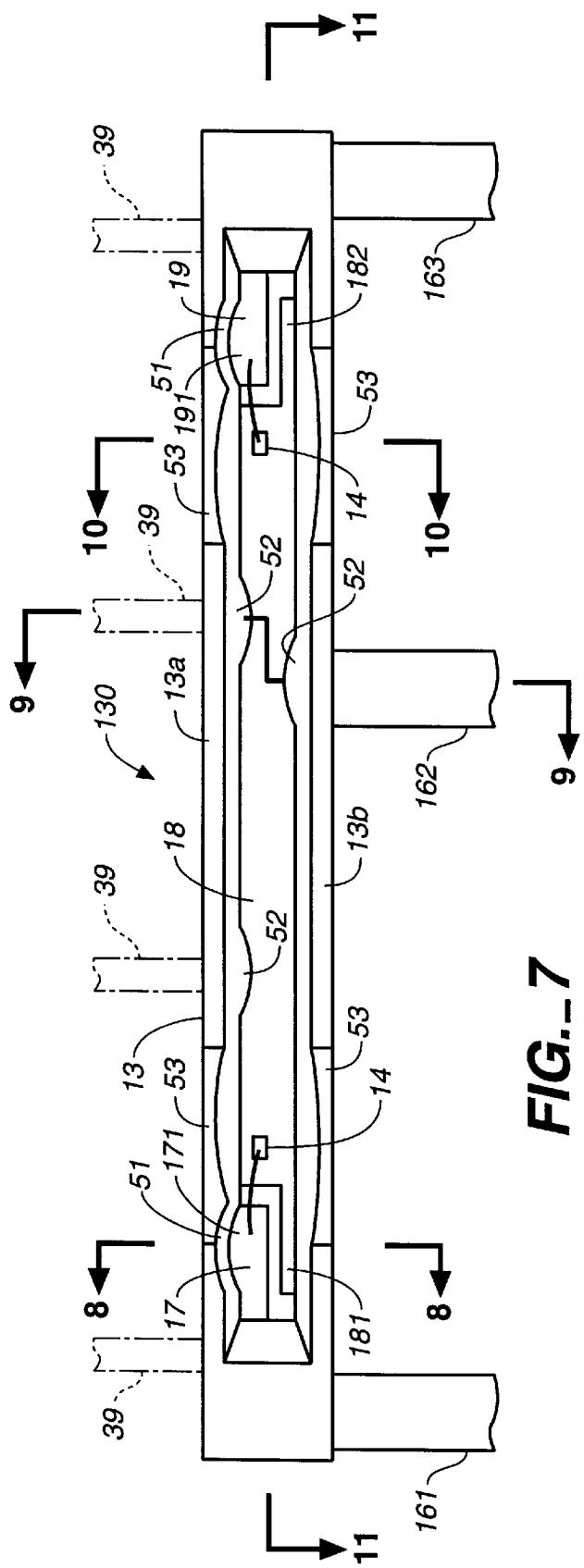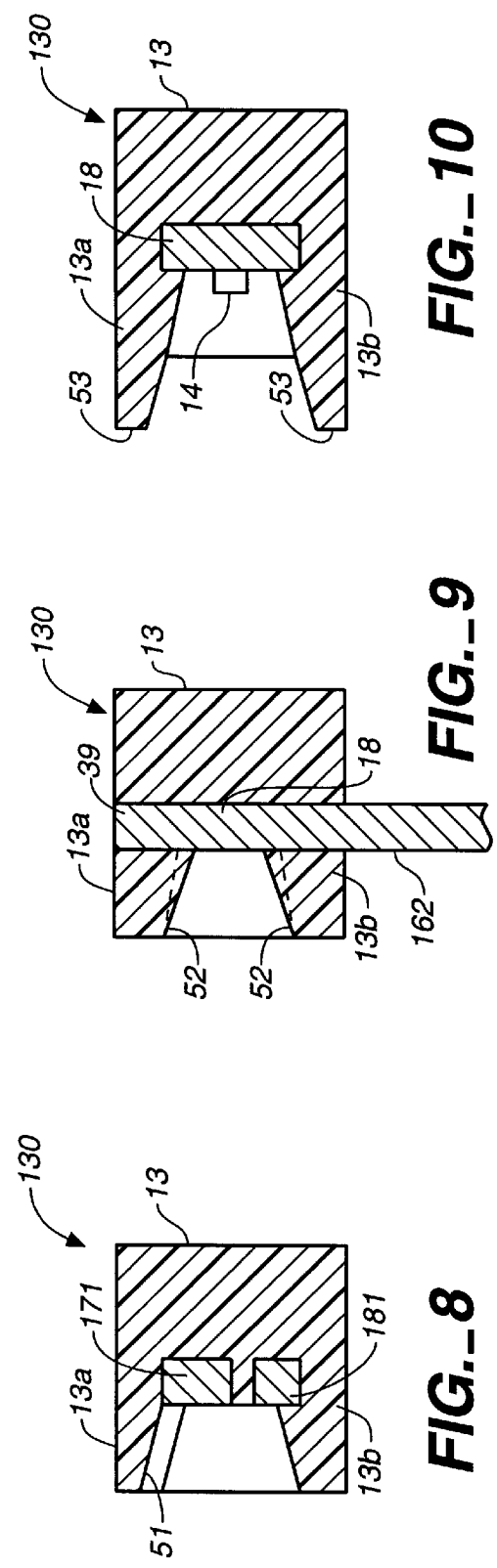

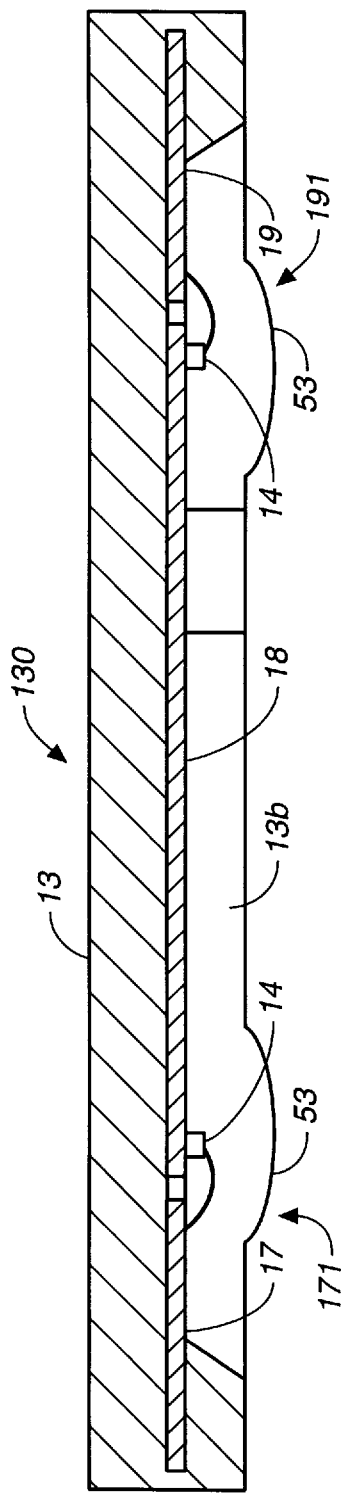
FIG._11
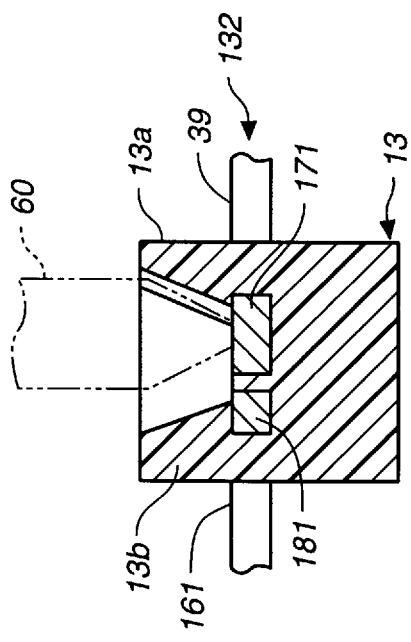
FIG._13

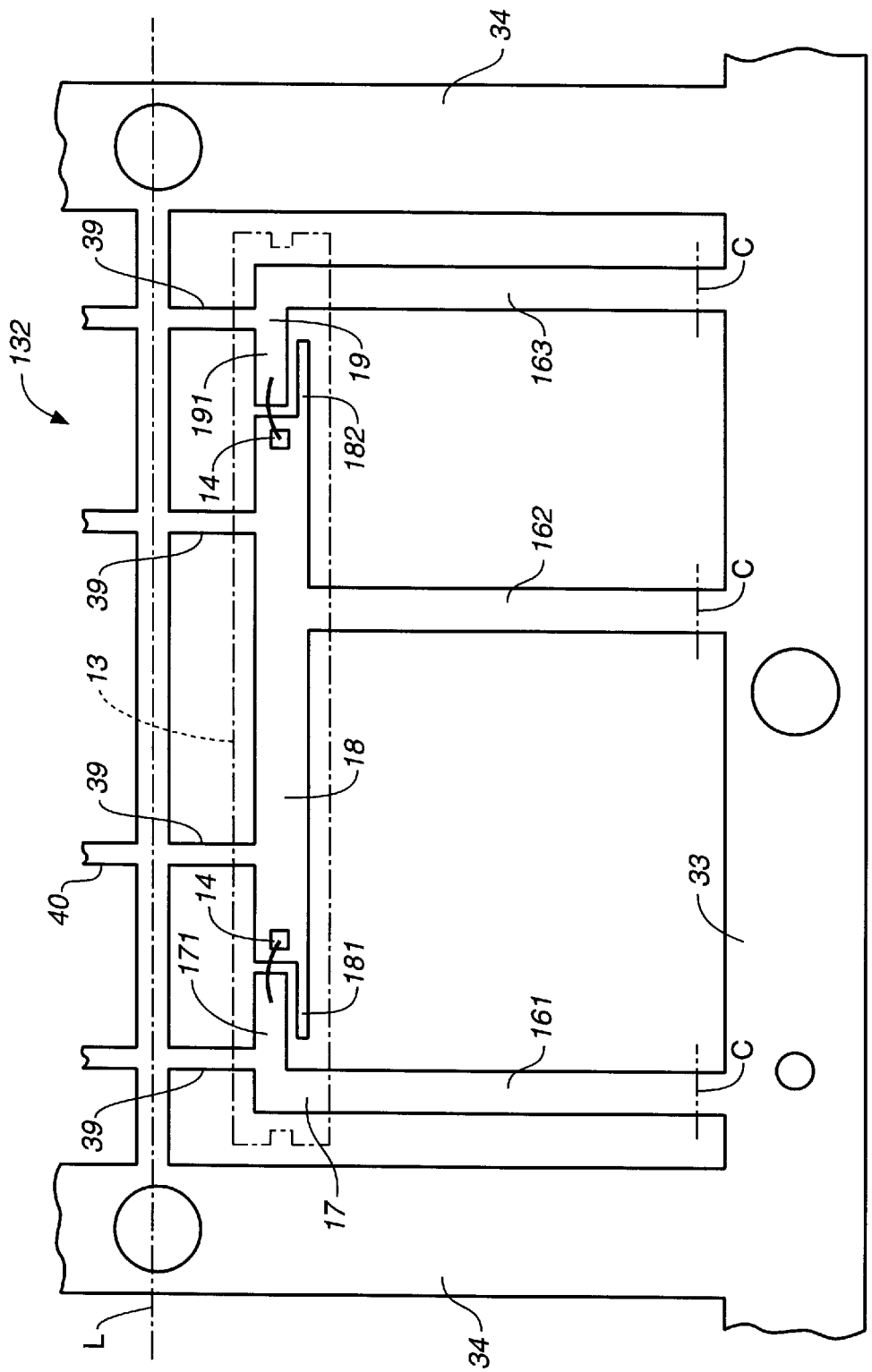
FIG._12

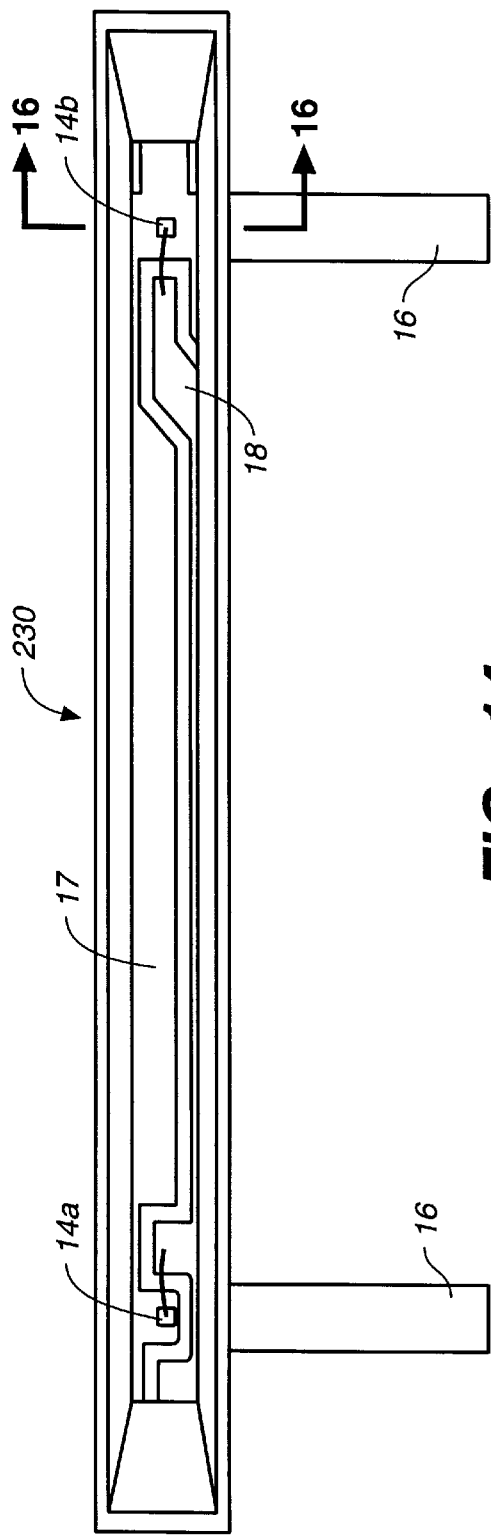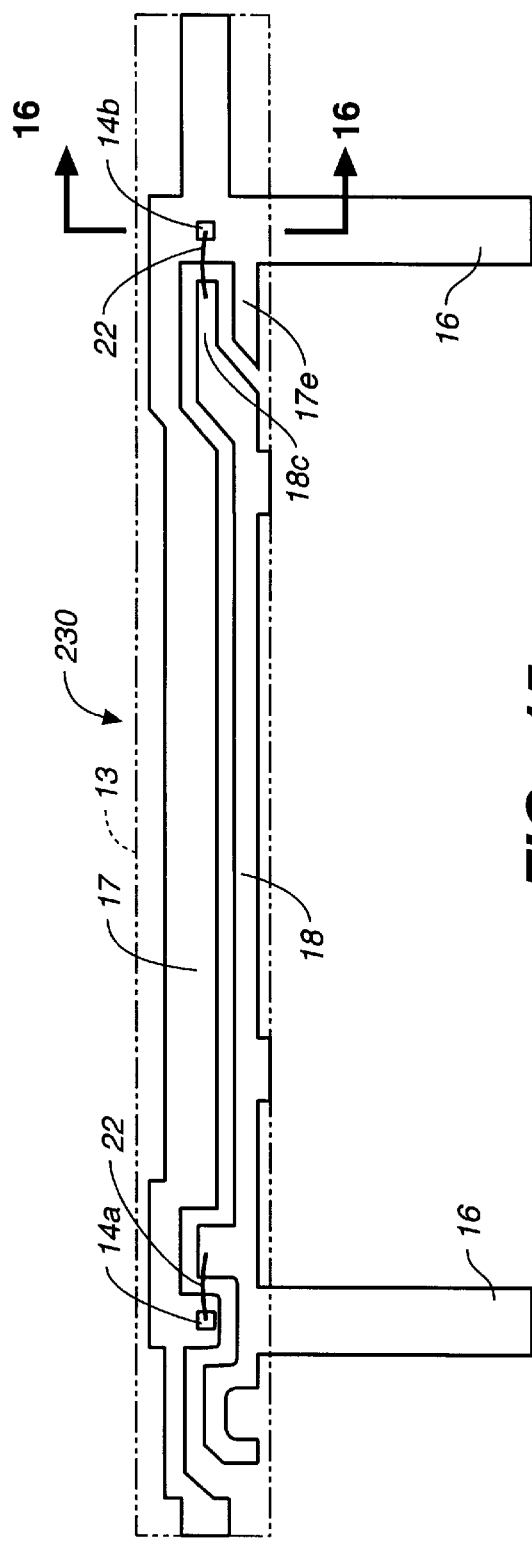

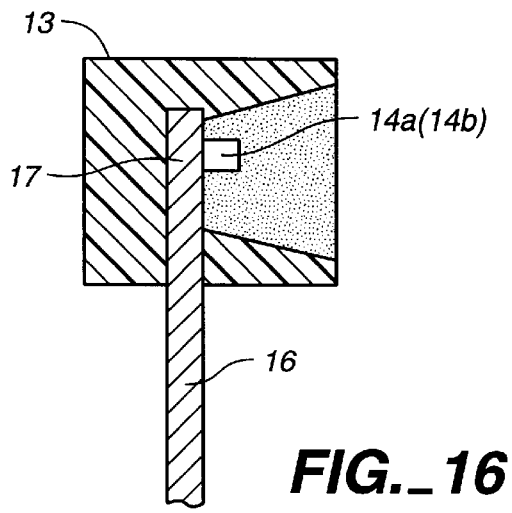
FIG._16
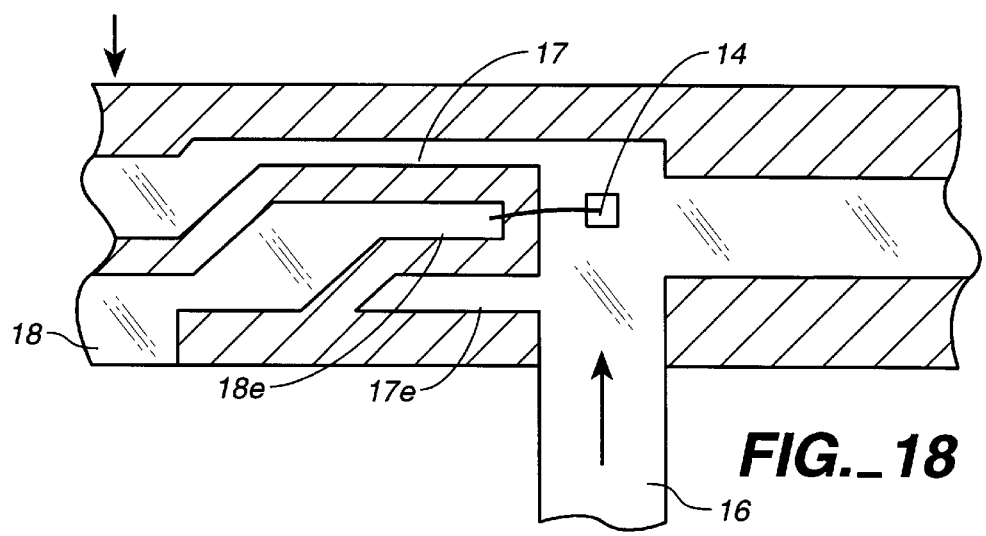
FIG._18
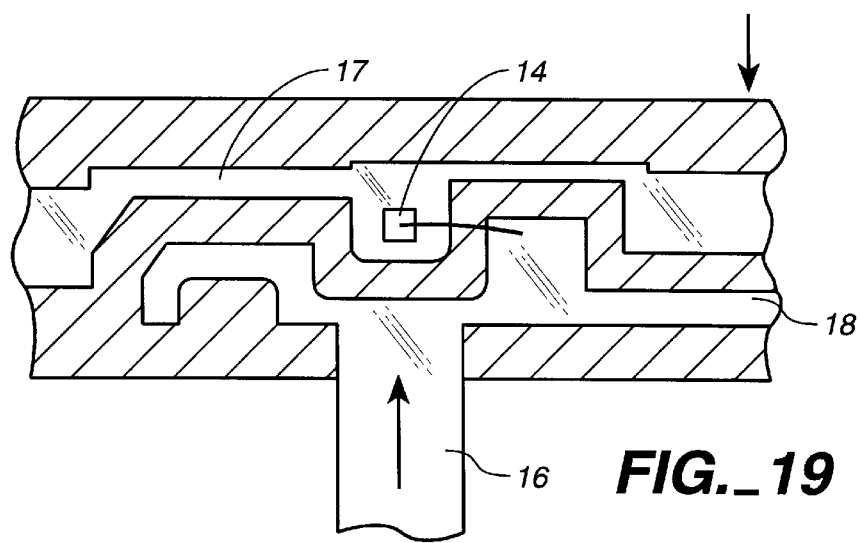
FIG._19

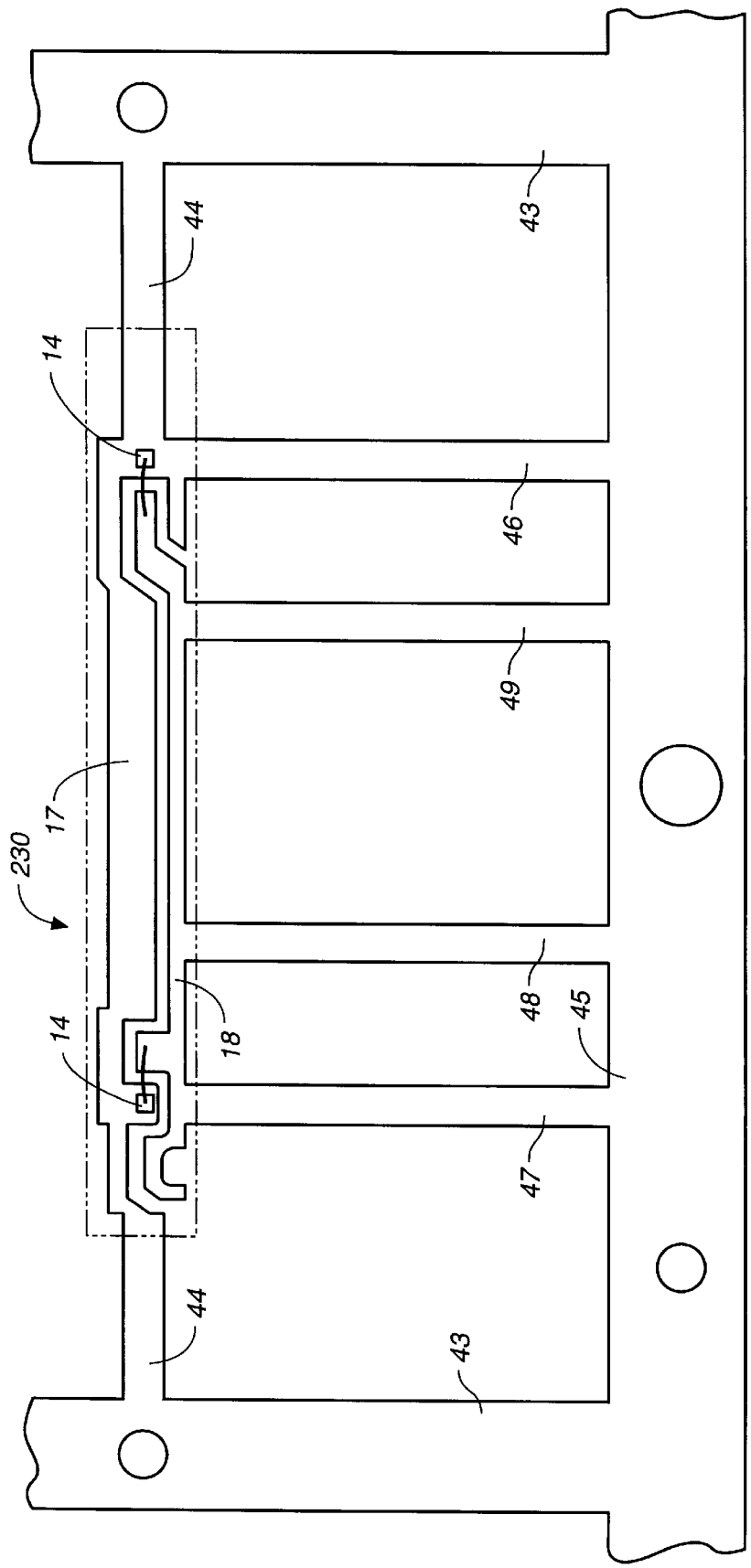
FIG._17

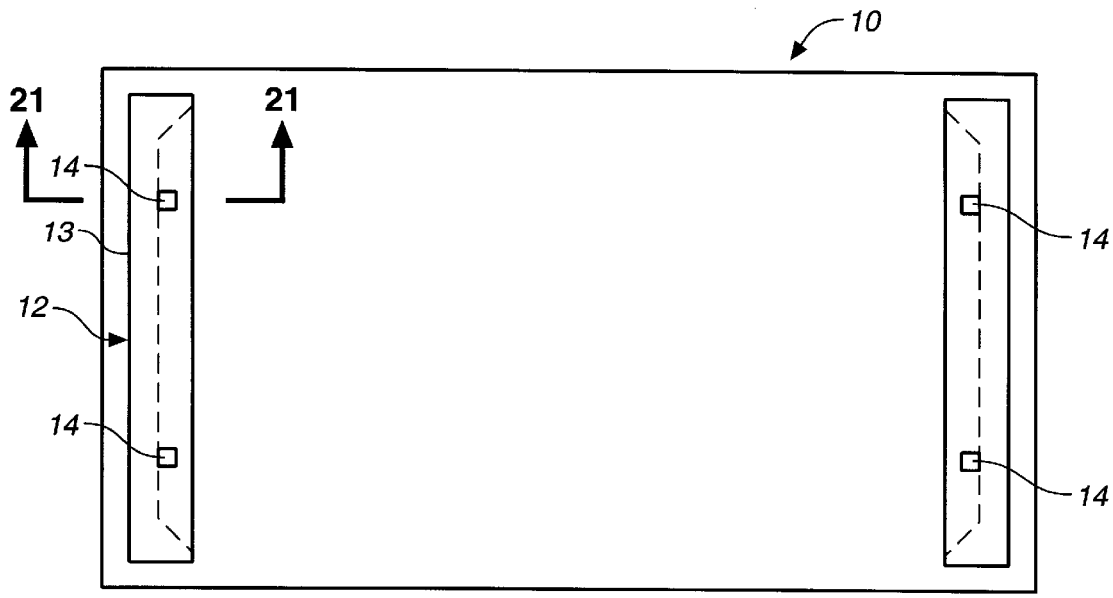
FIG._20
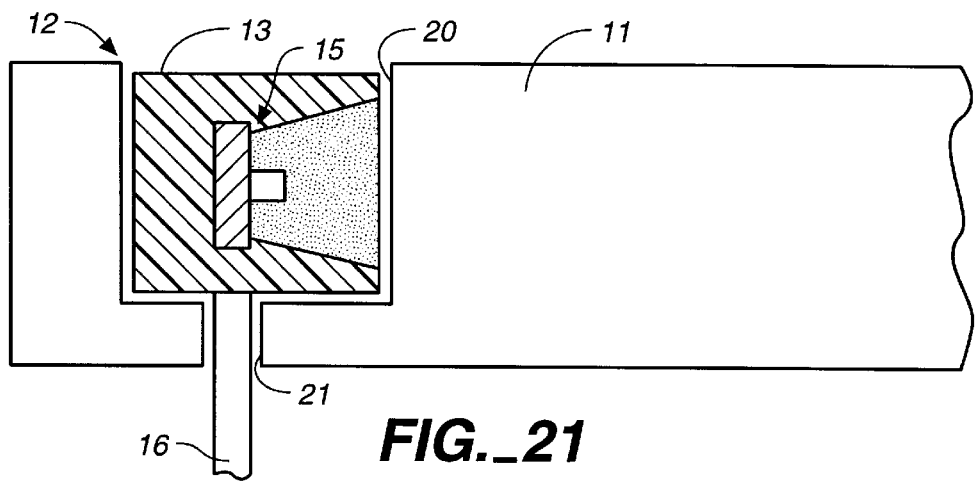
FIG._21
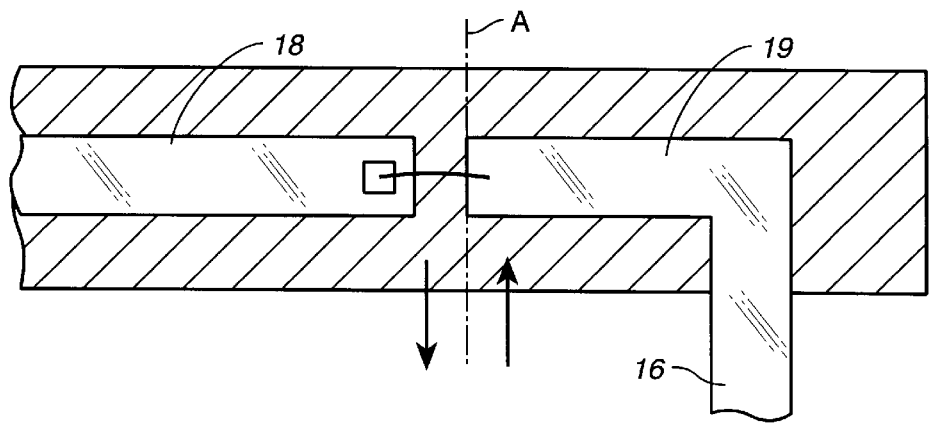
FIG._24
(PRIOR ART)

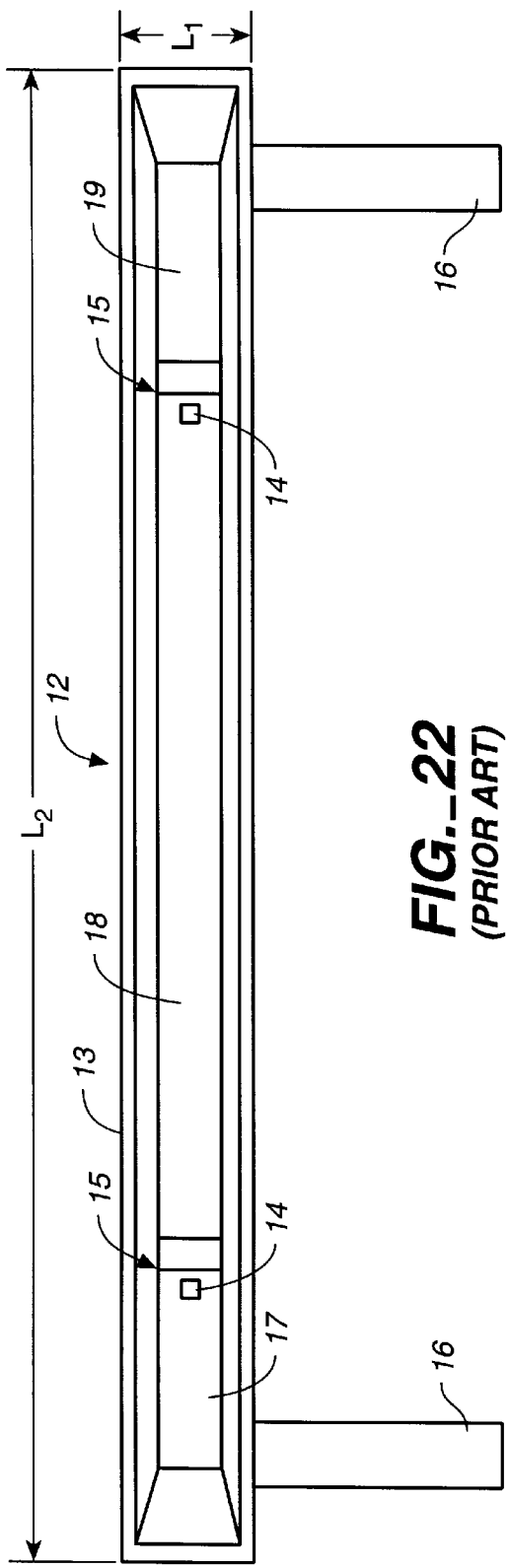
FIG._22 (PRIOR ART)
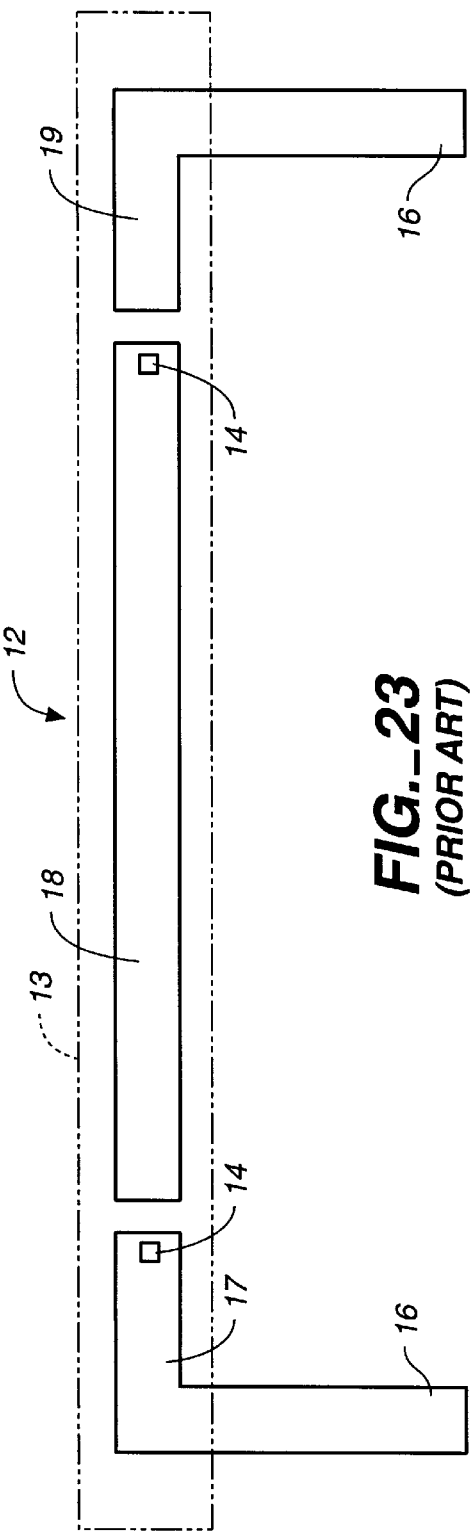
FIG._23 (PRIOR ART)

LIGHT-EMITTING DIODE DEVICE AND ILLUMINATOR WITH LIGHT-EMITTING SURFACE USING SAME

BACKGROUND OF THE INVENTION

This invention relates mainly to a light-emitting diode (LED) device and, more in particular, to such a device suited to be used as a light source for an illuminator with a light-emitting surface of a so-called back lighting type.

Liquid crystal panel displays are commonly used as a display device for a compact electronic apparatus because they can not only display many different kinds of patterns with small power but also can be made thin. These liquid crystal panel displays do not emit any light themselves and are often used in combination with an illuminator having a light-emitting surface of the back lighting type placed behind it so as to improve the visibility.

As shown in FIGS. 20 and 21, an illuminator 10 of this kind having a light-emitting surface generally comprises a light-conducting transparent or translucent rectangular plate 11 with a uniform thickness made of a resin material, and LED devices 12 serving as a light source are disposed along its mutually opposite shorter edges.

As shown in FIGS. 22 and 23, each LED device 12 comprises a horizontally elongated rectangular box-shaped reflector case 13 containing a specified number (two, according to this example) of LED chips 14 forming light source units 15, external terminal lead lines 16 extending downward from the bottom surfaces of these light source units 15. The height $L_1$ of the reflector case 13 is less than the thickness of the light-conducting plate 11, and its length $L_2$ may be suitably determined with respect to the planar dimensions of the light-conducting plate 11. The front surface of the reflector case 13 is open and its sloped inner walls serve as reflecting surfaces.

The two LED chips 14 of each LED device 12 are electrically connected to each other in series. As can be seen in FIGS. 23 and 24, there are three elongated terminal plates (first, second and third) 17, 18 and 19 disposed in series at the bottom of the reflector case 13. One of the LED chips 14 is bonded to an end part of IS the first terminal plate 17 and is connected to one end part of the second terminal plate 18 by wire bonding, and the other LED chip 14 is bonded to the other end part of the second terminal plate 18 and is connected to one end part of the third terminal plate 19 by wire bonding. The end parts of the first and third terminal plates 17 and 19 distal from the second terminal plate 18 are extended downward, serving as the external terminal lead lines 16. The bonding wires and the LED chips 14 are sealed inside the reflector case 13 by means of a transparent or translucent protective resin material.

As best shown in FIG. 21, the light-conducting plate 11 is provided with concave grooves 20 for containing therein the light source units 15 of the LED devices 12. Throughholes 21 are provided at the bottom of the grooves 20 for passing the external terminal lead lines 16 therethrough.

When the reflector case 13 is produced by a resin molding method, the three terminal plates 17, 18 and 19 are inserted together, but since they are inserted so as to be mutually separated longitudinally, as shown in FIG. 23, problems as described below sometimes occur when the LED devices 14 are installed inside the light-conducting plate 11.

When a LED device 12 is installed in the light-conducting plate 11 by using a suitable mounter, the reflector case 13 is usually held at a middle part in the longitudinal direction to be inserted into a specified groove 20. Since the terminal lead lines 16 at both end parts of the reflector case 13 experience some resistance as they are passed through the throughholes 21, shearing forces appear inside the reflector case 13 as shown by the arrows in FIG. 24. Such forces are concentrated where the terminal plates 17, 18 and 19 are separated with a gap in between, say, along the line A in FIG. 24. This makes it likely to generate cracks along such lines. Since it is considered desirable to make the light-conducting plate 11 as thin as possible, and the height of the reflector case 13 is less than this thickness, a situation as described above is very likely to occur. Since a bonding wire crosses the line A, such a crack, as it becomes larger across the line A, may adversely affect the electrical connection by the bonding wire.

SUMMARY OF THE INVENTION

It is therefore an object of this invention to provide an improved LED device of the type described above, having a plurality of LED chips at the bottom inside a horizontally elongated rectangular box-shaped reflector case and external terminal lead lines extending from the bottom surface of the reflector case, which does not cause disconnection of bonding wires at the time of installation.

A LED device embodying this invention, with which the above and other objects can be accomplished, may be characterized as comprising a horizontally elongated rectangular box-shaped reflector case having an open front surface and a plurality of mutually separated terminal plates disposed on its bottom part, a LED chip being bonded to one of a mutually adjacent pair of these terminal plates and connected through a wire to the other of the pair, one of this pair of terminal plates having an extended part which is vertically overlapped by and extends below the other of the pair of terminal plates. According to a preferred embodiment of the invention, a terminal lead line is extended downward from each of the terminal plates at both ends of the horizontally elongated terminal plates and those terminal plates at the ends are each provided with the kind of extended part extending below its adjacent terminal plate. According to a further preferred embodiment of the invention, these terminal plates are disposed longitudinally in series between the two end parts of the elongated reflector case.

When a LED device of this kind is inserted in a light-conducting plate to form an illuminator with a light-emitting surface, shearing strain is generated in the vertical direction inside the reflector case due to the resistance against the terminal lead lines. Such a shearing strain is particularly concentrated at the gaps between mutually adjacent pairs of the terminal plates and cracks are likely to result. If extended parts are provided for causing mutually adjacent pairs of terminal plates to overlap vertically, such shearing strain can be absorbed by horizontally extended parts and adverse effects of shearing stress can be prevented.

Mutually adjacent pairs of terminal plates may take various shapes where they overlap each other. The gap between such a pair may be L-shaped to provide a horizontal portion or bent in a zigzag formation. Two horizontally elongated terminal plates may be disposed one above the other with one end of the upper terminal plate U-shaped with a bottom part extending below the lower terminal plate. According to still another embodiment of the invention, one of a mutually adjacent pair of terminal plate has a thinner part which is upwardly displaced from the other of the pair. For the convenience of bonding operations on such a displaced part, the inner surface of the side frames of the reflector case may be provided with indentations such that a prior art bonding equipment can be used for the bonding operation.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a front view of a LED device according to a first embodiment of this invention;

FIG. 2 is a front view of the LED device of FIG. 1 with its reflector case removed for showing the structure inside;

FIG. 3 is an enlarged sectional view taken along line 3—3 of FIG. 1;

FIG. 4 is a plan view of a portion of a lead frame which may be used for the production of the LED device shown in FIG. 1;

FIG. 5 is a plan view of a portion of the LED device of FIG. 1 for showing the forces acting thereon when it is inserted into a light-conducting plate;

FIG. 6 is a front view of another LED device which is a variation of the device of FIG. 1 with its reflector case removed;

FIG. 7 is a front view of still another LED device according to a second embodiment of this invention;

FIG. 8 is an enlarged sectional view taken along line 8—8 of FIG. 7;

FIG. 9 is an enlarged sectional view taken along line 9—9 of FIG. 7;

FIG. 10 is an enlarged sectional view taken along line 10—10 of FIG. 7;

FIG. 11 is an enlarged sectional view taken along line 11—11 of FIG. 7;

FIG. 12 is a plan view of a portion of a lead frame which may be used for the production of the LED device shown in FIG. 7;

FIG. 13 is a sectional view of the LED device of FIG. 7 when a wire bonding process is being carried out;

FIG. 14 is a front view of still another LED device according to a third embodiment of this invention;

FIG. 15 is a front view of the LED device of FIG. 14 with its reflector case removed for showing the structure inside;

FIG. 16 is an enlarged sectional view taken along line 16—16 of FIGS. 14 and 15;

FIG. 17 is a plan view of a portion of a lead frame which may be used for the production of the LED device shown in FIG. 14;

FIG. 18 is a plan view of a portion of the LED device of FIG. 14 for showing the forces acting thereon when it is inserted into a light-conducting plate;

FIG. 19 is a plan view of another portion of the LED device of FIG. 14 for showing the forces acting thereon when it is inserted into a light-conducting plate;

FIG. 20 is a plan view of an illuminator with a light-emitting surface;

FIG. 21 is a sectional view taken along line 21—21 of FIG. 20;

FIG. 22 is a front view of a prior art LED device;

FIG. 23 is a front view of the prior art LED device of FIG. 22 with its reflector case removed; and FIG. 24 is a plan view of a portion of the prior art LED device of FIG. 22 for showing the forces acting thereon when it is inserted in a light-conducting plate.

Throughout herein, those components which are substantially the same or at least mutually alike are indicated by the same numerals although they are parts of different devices and may not be repetitiously described.

DETAILED DESCRIPTION OF THE INVENTION

FIGS. 1, 2 and 3 show a LED device 30 according to a first embodiment of this invention. Its external structure is the same as that of the prior art device 12 described above with reference to FIGS. 22 and 23, having a plurality (two according to this example) of LED chips 14a and 14b on its bottom part inside a horizontally elongated rectangular box-shaped reflector case 13 made of a resin material to form light source units 15, having terminal lead lines 16 extending downward from the bottom surface at both end parts of the light source units 15. The height $L_1$ of the reflector case 13 is less than the thickness of the light-conducting plate (shown at 11 in FIG. 20) in which this LED device 30 is installed, and its length $L_2$ may be suitably determined with respect to the planar dimensions of this light-conducting plate 11.

Arranged longitudinally on the bottom part of the reflector case 13 are three (first, second and third) elongated terminal plates 17, 18 and 19 for connecting the LED chips 14a and 14b in series. Explained more in detail with reference to FIG. 2, the first terminal plate 17 is on the left-hand side of the reflector case 13, the second terminal plate 18 is at a middle part of the reflector case 13, and the third terminal plate 19 is on the right-hand side of the reflector case 13, each disposed separate from the others. One of the LED chips (the first LED chip 14a) is bonded to a right-hand end part of the first terminal plate 17 and a wire 22 extended from this LED chip 14 is connected to one end part (on the left-hand side) of the second terminal plate 18. Similarly, the second LED chip 14b is bonded to the other end part (on the right-hand side) of the second terminal plate 18 and a wire 22 extended from this LED chip 14b is bonded to one end part (on the left-hand side) of the third terminal plate 19. Terminal lead lines 16 extending downward from the reflector case 13 are integrally formed from the first terminal plate 17 and the third terminal plate 19.

Unlike the terminal plates of the prior art LED device shown in FIG. 23, the first terminal plate 17 and the third terminal plate 19 according to this embodiment of the invention are provided with extended parts 17a and 19a, respectively, extending so as to reach overlappingly below the end parts of the second terminal plate 18. As a result, the gaps 31 between the first terminal plate 17 and the second terminal plate 18 and between the second terminal plate 18 and the third terminal plate 19 are each bent in the shape of the letter L.

When the LED device 30, thus structured as described above, is inserted into a light-conducting plate as shown at 11 in FIG. 21, forces shown in FIG. 5 by the arrows, for example, are exerted due to the resistance as the terminal lead lines 16 are inserted into the throughholes 21 in the light-conducting plate 11, thus resulting in shearing stress in the vertical direction between the first terminal plate 17 and the second terminal plate 18 and between the second terminal plate 18 and the third terminal plate 19. Because the extended parts 17a and 19a are provided to the first and third terminal plates 17 and 19, as explained above, however, the shearing stress can be absorbed by these extended parts 17a and 19a. Accordingly, occurrence of cracks can be effectively prevented between the terminal plates and the resin material where the gaps are between the terminal plates. Moreover, when the LED device 30 is inserted into the light-conducting plate, only a compressive force will be applied to the parts of the resin material between the extended parts 17a and 19a and the second terminal plate 18, there being no undesirable tensile forces. Thus, the terminal plates and the resin material are not separated to accelerate the generation of cracks.

The LED device 30, according to the first embodiment of this invention described above, may be produced from a lead frame 32 shown in FIG. 4, having cross frames 34 formed at equal intervals, perpendicularly extending from a side frame 33 which extends longitudinally. The first terminal plate 17 is supported by a lead line 35 extending from the side frame 33 and another lead line 36 extending from one of the cross frames 34. Similarly, the third terminal plate 19 is supported by a lead line 37 extending from the side frame 33 and another lead line 38 extending from the next cross frame 34. The second terminal frame 18, situated between the first terminal plate 17 and the third terminal plate 19, is supported by two support lead lines 39 and 40 extending from the same side frame 33.

The reflector case 13 is formed by a resin molding method at the position indicated by a broken line in FIG. 4. The LED chips 14 are bonded to portions of the terminal plates 17, 18 and 19 on the bottom part of the reflector case 13 and a wire-bonding process is carried out. Thereafter, the interior of the reflector case 13 containing the LED chips 14 and the bonding wires 22 is sealingly filled with a transparent or translucent protective resin. Finally, the LED device 30 shown in FIGS. 1–3 is obtained by cutting the lead lines 36, 38, 39 and 40 along the outer surface of the reflector case 13 and the lead lines 35 and 37 near the side frame 33 such that the terminal lead lines 16 will be left.

FIG. 6 shows another LED device 30' which is a variation of the first embodiment of this invention, different from the device 30 described above with reference to FIGS. 1–3 in that extended parts (such as shown at 17b, 17c, 18b and 18c) are formed at the end parts of the terminal plates where LED chips 14 are bonded and that protrusions (such as shown at 18d and 19d) are formed at the end parts where the LED chips 14 are wire-bonded such that each of these protrusions is overlappingly between the two extended parts and that the gaps between each mutually adjacent pair of these terminal plates 17, 18 and 19 are bent in a zigzag formation.

When forces, as indicated by the arrows in FIG. 6, are applied on the LED device 30', providing a shearing stress in the vertical direction inside the reflector case 13, this can again be effectively absorbed by these extended parts 17b, 17c, 18b and 18c and the protrusions 18d and 19d. Generation of cracks can thus be prevented effectively between the mutually adjacent pairs of the terminal plates 17, 18 and 19.

FIGS. 7–11 show still another LED device 130 according to a second embodiment of this invention having two LED chips 14 on the bottom part of an horizontally elongated rectangular box-shaped reflector case 13 with frame walls 13a and 13b protruding forward from the bottom part. Three (first, second and third) terminal plates 17, 18 and 19 are on the bottom part of the reflector case 13. The first terminal plate 17 has a first terminal lead line 161 integrally formed and extending downward. The second terminal plate 18 has a second terminal lead line 162 integrally formed and extending downward. The third terminal plate 19 has a third terminal lead line 163 integrally formed and extending downward.

The LED device 130, described above, may be produced from a lead frame 132 shown in FIG. 12, with reference to which the shapes of the three terminal plates 17, 18 and 19 will be explained next.

As can be seen in FIG. 12, the inner portions 171 and 191 for wire bonding (proximal to the second terminal plate 18) of the first and third terminal plates 17 and 19, respectively, are made thinner than the second terminal plate 18. Outwardly protruding parts 181 and 182 are formed from both ends of the second terminal plate 18 so as to overlappingly extend below the wire-bonding portions 171 and 191 of the first and third terminal plates 17 and 19, respectively. The LED chips 14 are bonded to both end parts of the second terminal plate 18 at points which are at about the middle in the direction of its width. An electrode on the top surface of each of these LED chips 14 is connected by wire-bonding to a corresponding one of the wire-bonding portions 171 and 191 of the first and third terminal plates 17 and 19. Since the center lines of the wire-bonding portions 171 and 191 of the first and third terminal plates 17 and 19 are upwardly displaced from the center line of the second terminal plate 18 (and also of the reflector case 13), the second bonding operations on the wire-bonding portions 171 and 191 are effected at positions somewhat displaced upward from the center line of the reflector case 13. Thus, the two LED chips 14 shown in FIG. 12 are electrically connected in parallel with respect to the LED device 130. After the bonding and wire-bonding processes are completed, the interior of the reflector case 13 may be filled with a transparent resin or a resin material mixed with a dispersant.

The reflector case 13 is formed by a resin molding process as shown by a broken line in FIG. 12. FIG. 12 is to be understood as showing only one unit portion of the lead frame which usually contains many units, say, in two rows, line L in FIG. 12 representing the line of symmetry between the two rows of unit portions. Unit portions in each row are mutually separated by cross frames 34 extending perpendicularly to longitudinally extending side frames 132. The terminal plates 17, 18 and 19 and the terminal lead lines 161, 162 and 163 extending therefrom of each unit portion are supported by the side frame 33 and through support lead lines 40 by the cross frames 34.

After the reflector case 13 is formed on the lead frame 132 thus structured, the LED chips 14 are bonded and wire-bonded, as explained above, to the terminal plates 17, 18 and 19 on the bottom part inside the reflector case 13. The interior of the reflector case 13 may then be filled with a transparent or translucent resin material, as explained above. After certain parts of the lead frame 132, especially where the lead terminal lines 161, 162 and 163 are formed, are subjected to a solder plating process, the support lead lines 39 are cut along the outer surface of the reflector case 13, and each of the lead terminal lines 161, 162 and 163 are cut along lines C shown in FIG. 12 to obtain the LED device 130 with three lead terminal lines 161, 162 and 163 extending therefrom.

As explained above, the wire bonding portions 171 and 191 are not exactly aligned with the horizontal center line of the second terminal plate 18 because they are required to overlap with the protrusions 181 and 182 from the second terminal plate 18. In order to be able to perform the second bonding processes at such displaced positions by using a prior art capillary 60 of a conventional wire bonding equipment, as shown in FIG. 13, the frame walls 13a and 13b of the reflector case 13 are provided with indentations 51, as shown in FIGS. 7 and 8, at positions corresponding to the bonding portions 171 an 191 and in the direction in which they are displaced from the center line of the second terminal plate 18 (or the reflector case 13). Such indentations 51 can be formed easily by modifying the mold for the production of the reflector case 13.

It now goes without saying that the LED device 130 according to the second embodiment of this invention is also capable of preventing generation of cracks due to the shearing stress on the reflector case when the LED device is inserted into a light-conducting plate because the protrusions 181 and 182 of the second terminal plate 18 overlap with the bonding portions 171 and 191 in the direction of the width.

It is to be noted with reference to FIG. 12 that the support lead lines 39 are extended opposite to the lead terminal lines 161, 162 and 163 from the terminal plates 17, 18 and 19, but this is not a mere matter of design choice without any better purposes. When the interior of the reflector case 13 is filled with a resin material after the reflector case 13 is formed and the LED chips 14 are bonded and wire-bonded, the lead terminal lines 161, 162 and 163 are coated with a solder material by a solder dipping method. The support lead lines 39 and 40 are intended at this time to serve to conduct the heat from the molten solder efficiently away such that the separation of the lead terminal lines from the reflector case due to thermal strain can be effectively prevented.

At the final stage of the production, the support lead lines 39 are cut off along the outer surface of the reflector case 13 and the lead terminal lines 161, 162 and 163 are cut along lines C shown in FIG. 12. At this point, the lead terminal lines 161, 162 and 163 may be subjected to a so-called lead-forming process for reshaping. In order to prevent the separation of the resin material of the reflector case 13 from the terminal plates 17, 18 and 19 due to forces exerted during such lead-cutting and lead-forming processes, thickened parts 52 are provided, as shown in FIGS. 7 and 9, on the inner surfaces of the frame walls 13a and 13b at positions corresponding to the support lead lines 39 for added strength.

In order to prevent the light from the LED chips 14 directly escaping to the exterior through the light-conducting plate 11 after the LED device 130 is installed, forwardly extended parts 53 in the shape of a convex circular arc are also provided, as shown in FIGS. 7, 10 and 11. This also serves to prevent partial illumination of areas near the LED chips 14.

FIGS. 14–16 show still another LED device 230 according to a third embodiment of this invention, of which the reflector case 13 is of the same structure as that of the LED device 30 according to the first embodiment of the invention described above, but the two LED chips 14a and 14b disposed on the bottom part of the reflector case 13 are connected electrically in parallel.

As more clearly seen in FIG. 15, there are two (first and second) terminal plates 17 and 18 provided on the bottom part of the reflector case 13, both extending longitudinally with the first terminal plate 17 extending above the second terminal plate 18. The two LED chips 14a and 14b are bonded to the mutually opposite end parts of the first terminal plate 17 and the wires extending from these LED chips 14a and 14b are each connected to a convenient part of the second terminal plate 18 by wire bonding. The right-hand end part of the first terminal plate 17 is integrally extended downward to form a terminal lead line 16, and the left-hand end part of the second terminal plate 18 is integrally extended downward to form another terminal lead line 16.

According to this embodiment of the invention, the right-hand end part of the first terminal plate 17 is U-shaped so as to surround the right-hand end part 18c of the second terminal plate 18 not connected to its terminal lead line 16. In other words, the right-hand end part of the first terminal plate 17 has a bottom part 17e which extends overlappingly below the right-hand end part 18c of the second terminal plate 18.

When the LED device 230 thus structured is inserted into the light-conducting plate 11, forces as shown by the arrows in FIGS. 18 and 19 are exerted, providing shearing strain in the vertical direction inside the reflector case 13. Because the bottom part 17e of the first terminal plate 17 and the second terminal plate 18 are overlapped in the vertical direction, the shearing strain as shown in FIG. 18 can be effectively absorbed. At the left-hand end part, since the first terminal plate 17 and the second terminal plate 18 are overlapped generally in the vertical direction, the shearing strain by the forces shown in FIG. 19 can also be effectively absorbed. Thus, generation of cracks due to such shearing strain can be efficiently prevented.

It is to be noted that the gap between the first terminal plate 17 and the second terminal plate 18 is not straight but is bent in a zigzag way. This has the effect of increasing the contacting boundary between the resin material in between and the terminal plates 17 and 18. It now goes without saying that this also contributes significantly to preventing the separation of the resin material from the terminal plates due to internal forces.

The LED device 230 according to the third embodiment of this invention may be produced by using a lead frame 42 shown in FIG. 17. The first terminal plate 17 is supported by support lead lines 44 extended from cross frames 43 and another lead line 46 extended from a side frame 45. The second terminal plate 18 is supported by three support lead lines 47, 48 and 49 extended from the side frame 45. The lines 46 and 47 are not cut off after the reflector case 13 is formed and serve as the terminal lead lines 16 shown in FIGS. 14–16.

Although the invention has been described above with reference to only a limited number of embodiments, these embodiments are not intended to limit the scope of the invention. Many modifications and variations are possible within the scope of this invention. For example, the number of LED chips for each LED device is not limited to two. All such modifications and variations that may be apparent to an ordinary person skilled in the art are intended to be within the scope of this invention.

What is claimed is:

1. A light-emitting diode (LED) device comprising:
    a horizontally elongated rectangular box-shaped reflector case having an open front surface and a bottom part;
    a plurality of mutually separated terminal plates disposed on said bottom part; and LED chips each bonded to one of a mutually adjacent pair of said terminal plates and connected through a wire to the other of said pair;
    said one terminal plate having an extended part which extends on said bottom part below said the other terminal plate.

2. The LED device of claim 1 wherein said elongated reflector case has two end parts, those of said terminal plates which are at said end parts of said reflector case each having a terminal lead line extending downward from said reflector case.

3. The LED device of claim 2 wherein each of said terminal plates at said end parts has an extended part which extends below and overlapped by a neighboring terminal plate adjacent thereto.

4. The LED device of claim 2 wherein said plurality of terminal plates are aligned longitudinally in a row between said end parts.

5. The LED device of claim 3 wherein said plurality of terminal plates are aligned longitudinally in a row between said end parts.

6. A LED device comprising:

a horizontally elongated rectangular box-shaped reflector case having an open front surface and a bottom part;

a plurality of mutually separated terminal plates disposed on said bottom part in series along said elongated reflector case; and LED chips each bonded to one of a mutually adjacent pair of said terminal plates and connected through a wire to the other of said pair, mutually opposite edges of said mutually adjacent pair of said terminal plates being bent so as to have sections at which said opposite edges overlap each other vertically.

7. The LED device of claim 6 wherein said elongated reflector case has two end parts, those of said terminal plates which are at said end parts of said reflector case each having a terminal lead line extending downward from said reflector case.

8. A LED device comprising:

a horizontally elongated rectangular box-shaped reflector case having an open front surface, a bottom part and two end parts;

a first horizontally elongated terminal plate disposed on said bottom part;

a second horizontally elongated terminal plate disposed separate from, parallel to, below and in a side-by-side relationship with said first terminal plate; and a plurality of LED chips each bonded to either one of said first and second terminal plates and connected through a wire to the other of said first and second terminal plates;

said first terminal plate having a terminal lead line extended downward from one of said end parts of said reflector case, and said second terminal plate having another terminal lead line extended downward from the other of said end parts of said reflector case, said second terminal plate at said the other end part being surrounded in a U-shape by a portion of said first terminal plate.

9. A LED device comprising:

a horizontally elongated rectangular box-shaped reflector case having an open front surface, a bottom part and side frames with inner surfaces protruding forward from said bottom part;

a plurality of mutually separated terminal plates, including a mutually adjacent pair, disposed on said bottom part, one of said pair of terminal plates having a wire-bonding part which is thinner than the other of said pair and displaced vertically from said the other terminal plate, said the other terminal plate of said pair having an extended part which is vertically overlapped by said wire-bonding part; and a LED chip bonded to said the other terminal plate and connected through a wire to said wire-bonding part;

said inner surfaces of said side frames having an indentation which is formed at a position corresponding to said wire-bonding part in the direction of displacement of said wire-bonding part from said the other terminal plate.

10. The LED device of claim 1 which is inserted inside and along one edge of a light-conducting plate with a specified thickness and thereby forms an illuminator with a light-emitting surface.

11. The LED device of claim 6 which is inserted inside and along one edge of a light-conducting plate with a specified thickness and thereby forms an illuminator with a light-emitting surface.

12. The LED device of claim 8 which is inserted inside and along one edge of a light-conducting plate with a specified thickness and thereby forms an illuminator with a light-emitting surface.

13. The LED device of claim 9 which is inserted inside and along one edge of a light-conducting plate with a specified thickness and thereby forms an illuminator with a light-emitting surface.

14. The LED device of claim 2 which is inserted inside a groove provide along one edge of a light-conducting plate having a specified thickness and throughholes, said terminal lead lines penetrating said throughholes, thereby forming an illuminator with a light-emitting surface.

15. The LED device of claim 4 which is inserted inside a groove provide along one edge of a light-conducting plate having a specified thickness and throughholes, said terminal lead lines penetrating said throughholes, thereby forming an illuminator with a light-emitting surface.

16. The LED device of claim 7 which is inserted inside a groove provide along one edge of a light-conducting plate having a specified thickness and throughholes, said terminal lead lines penetrating said throughholes, thereby forming an illuminator with a light-emitting surface.

17. The LED device of claim 8 which is inserted inside a groove provide along one edge of a light-conducting plate having a specified thickness and throughholes, said terminal lead lines penetrating said throughholes, thereby forming an illuminator with a light-emitting surface.

* * * * *